(12) United States Patent
Kong et al.

(10) Patent No.: US 11,024,609 B2
(45) Date of Patent: Jun. 1, 2021

(54) FOUR-IN-ONE MINI-LED MODULE, DISPLAY SCREEN AND MANUFACTURING METHOD

(71) Applicant: SHENZHEN ZHIXUNDA OPTOELECTRONICS CO., LTD., Guangdong (CN)

(72) Inventors: Yiping Kong, Guangdong (CN); Xincheng Yuan, Guangdong (CN); Minkang Zhou, Guangdong (CN)

(73) Assignee: SHENZHEN ZHIXUNDA OPTOELECTRONICS CO., LTD., Shenzhen (CN)

( * ) Notice: Subject to any disclaimer, the term of this patent is extended or adjusted under 35 U.S.C. 154(b) by 169 days.

(21) Appl. No.: 16/280,024

(22) Filed: Feb. 19, 2019

(65) Prior Publication Data
US 2019/0385987 A1    Dec. 19, 2019

(30) Foreign Application Priority Data
Jun. 14, 2018   (CN) .......................... 201810610475.0

(51) Int. Cl.
*H01L 25/075*       (2006.01)
*H01L 21/66*        (2006.01)
(Continued)

(52) U.S. Cl.
CPC .......... *H01L 25/0753* (2013.01); *H01L 22/12* (2013.01); *H01L 24/48* (2013.01);
(Continued)

(58) Field of Classification Search
CPC ..... H01L 25/0753; H01L 22/12; H01L 24/48; H01L 33/56; H01L 33/62; H01L 33/647
See application file for complete search history.

(56) References Cited

U.S. PATENT DOCUMENTS

| 2010/0066229 A1* | 3/2010 | Hamby | G02F 1/133603 313/1 |
| 2013/0270581 A1* | 10/2013 | Lowes | H01L 33/48 257/88 |
| 2019/0259736 A1* | 8/2019 | Li | G09F 9/33 |

FOREIGN PATENT DOCUMENTS

| CN | 103531108 A | 1/2014 |
| CN | 103594464 A | 2/2014 |

(Continued)

OTHER PUBLICATIONS

Search Report of counterpart European Patent Application No. 19157081.1 dated Sep. 5, 2019.

*Primary Examiner* — Lex H Malasawma

(57) ABSTRACT

Disclosed is a four-in-one mini-LED module, a display screen, and a manufacturing method thereof. The four-in-one mini-LED module comprises a substrate and a plurality of RGB-LED chip sets arranged in an array on the substrate. The RGB-LED chip sets are provided with glue layers. Each RGB-LED chip set comprises an R chip, a G chip and a B chip, each chip has a first electrode and a second electrode, and the first electrode and the second electrode have opposite polarities. The first electrodes of all the chips of the same row are electrically connected, the second electrodes of all the R chips of the same column are electrically connected, the second electrodes of all the G chips of the same column are electrically connected, and the second electrodes of all the B chips of the same column are electrically connected.

12 Claims, 7 Drawing Sheets

(51) Int. Cl.
*H01L 23/00* (2006.01)
*H01L 33/56* (2010.01)
*H01L 33/62* (2010.01)
*H01L 33/64* (2010.01)

(52) U.S. Cl.
CPC .............. *H01L 33/56* (2013.01); *H01L 33/62* (2013.01); *H01L 33/647* (2013.01); *H01L 2224/48227* (2013.01); *H01L 2924/12041* (2013.01); *H01L 2933/005* (2013.01); *H01L 2933/0066* (2013.01); *H01L 2933/0075* (2013.01)

(56) References Cited

FOREIGN PATENT DOCUMENTS

| | | | |
|---|---|---|---|
| CN | 105098047 A | 11/2015 | |
| CN | 106847800 A | 6/2017 | |
| CN | 106847801 A | 6/2017 | |
| CN | 106876375 A | 6/2017 | |
| CN | 206340544 U | 7/2017 | |
| CN | 107614620 A | 1/2018 | |
| CN | 206947335 U | 1/2018 | |
| CN | 108091644 A | 5/2018 | |
| DE | 202017106116 U1 | 11/2017 | |
| WO | WO-2018176657 A1 * | 10/2018 | ........... H01L 33/486 |

* cited by examiner

A-A

B-B

FOUR-IN-ONE MINI-LED MODULE, DISPLAY SCREEN AND MANUFACTURING METHOD

CROSS REFERENCE TO RELATED APPLICATIONS

The present application claims the benefit of Chinese Patent Application No. 201810610475.0 filed on Jun. 14, 2018, the contents of which are incorporated herein by reference in its entirety.

TECHNICAL FIELD

The present invention relates to an LED packaging technology, and more particularly relates to a four-in-one mini-LED module, a display screen, and a manufacturing method.

BACKGROUND ART

LEDs were born in 1923. When Rousseff studied a semiconductor sic, he discovered that an impurity-doped p-n junction emits light after being energized. Thus, the light emitting diodes (LEDs) were developed, but the application of the LEDs had not gained much attention later. With the rapid development of the electronic industry, in the 1960s, the display technology had developed rapidly, and various display technologies are developed such as plasma display panels, LED liquid crystal displays, and light emitting diodes (LED). As semiconductor manufacturing and processing technologies have been matured and perfected gradually, light emitting diodes have become increasingly dominant in solid-state displays.

LEDs are widely valued and rapidly developed because of their many advantages such as high brightness, low operating voltage, low power consumption, easy integration, simple driving, long life, impact resistance and stable performance, so development prospects thereof are extremely broad. It is currently developing towards higher brightness, higher weather resistance and high luminous density, high uniformity of luminance, and full color. With the development, people need a large-screen display device, so a projector is developed. But its brightness limits the use under natural light, so an LED display (screen) is developed, which has the characteristics of large viewing angle, high brightness, and colorfulness.

The first-generation LED display screen uses a monochrome red color as a primary color and mainly displays text and simple patterns, which is mainly used for notification, announcement and passenger flow guidance systems. The second-generation LED display is a dual-primary-color multi-gray display screen using red and yellow-green as primary colors. Because there is no blue color, it can only be called pseudo color, which can display multi-gray images and videos. At present, it is widely used in telecommunications, banking, taxation, hospitals, government agencies and other occasions in China, and mainly displays slogans, public service advertisements and image publicity information. The third-generation LED display is a full-color multi-gray display screen using red, blue and yellow-green as primary colors, which can display more realistic images. The fourth-generation LED display is a true-color multi-gray display screen using red, blue and pure green as primary colors, which can truly reproduce all the colors of nature (even the color beyond the natural color range in color coordinates). A variety of video images and colored advertisements can be displayed, and the display screen has an excellent visual impact in the field of advertising due to gorgeous color, high brightness and fine contrast. A true-color 5 mm indoor large screen belongs to the above fourth-generation product. It has high brightness, is not affected by environmental brightness, has small thickness, small occupation, rich colors and wide viewing angle, and can be applied in a spacious hall environment without loss caused by mosaic images.

At present, LED display screens are developing in a small pitch or even a micro-pitch, and an LED display screen often integrates hundreds of thousands to millions of LEDs. The existing small-pitch LED display screens mainly use 2121, 1515, 1010, 0808 and other types of packaging devices. The small-pitch LED display screens refer to indoor LED display screens with an LED dot pitch of P2.5 or below, which mainly comprises P2.5, P2.083, P1.923, P1.8, P1.667, P1.5 and other LED display screen products. At present, manufacturers have been making micro-pitch LED display screens with a dot pitch of below P1.5. However, as the pixel pitch of the LED display screen is reduced, the number of packaging devices per unit area is increasing, which makes the packaging difficulty increase exponentially.

The existing LED display screens are mostly in the form of single-package, that is, the LEDs are mounted one by one. As the number of packaging devices per unit area increases, the mounting workload and the mounting difficulty will be also greatly increased. In order to solve this problem, many manufacturers currently use COB package, i.e., chip-on-board package, which is a novel packaging manner that is different from a surface mounted packaging technology for surface mounted devices (SMD). Specifically, an unpacked chip is adhered to a PCB by a conductive or non-conductive glue, then leading-wire bonding is performed to achieve an electrical connection, and the chip and the bonding wire are encapsulated with glue. The COB packaging has been applied in the field of lighting for many years, which can effectively improve the production efficiency and has obvious advantages compared with the traditional packaging types. However, COB packaging has not been widely used in the field of LED display screens so far. The reason is that the panel ink color of COB packaging is not well controlled. When a lamp is not turned on, the surface ink color is inconsistent. The center value difference or the ink difference of substrates of different batches of chips lead to color difference, and the entire screen consistency is poor. Besides, the chip is directly mounted on a circuit board and lacks of protection, so that the reliability cannot be guaranteed, and the maintenance cost of an ineffective LED chip is high.

For the problem of single-package, the applicant uses the mode of a packaging module, that is, a plurality of sets of RGB-LED chips are packaged on the same module, such as the Chinese patents No. CN106847801A and CN106847800A, as shown in FIG. 1. The above patent integrates a plurality of light-emitting units on a single packaging module, which can effectively solve the problem of low efficiency of single-packaging, and does not directly solder a chip on a PCB, thereby solving the problems of poor entire screen consistency of COB packaging, high maintenance cost and the like.

However, there are some problems in the actual production of the above patents, as follows:

First, there are too many pin bonding-pads on the back surface of the substrate. The existing small-pitch display screens mainly use 1515, 1010, 0808, 0606, 0505 and other types of packaging devices, all of which are 4-pin devices, one anodes or cathodes of red chips, green chips and blue chips are connected in parallel through a common-anode or a common-cathode manner, and the other pin is separately led out. When the solutions of the patents such as CN106847801A and CN106847800A are used, a plurality of light-emitting units are integrated into one packaging module, but the number of pins is not reduced. As shown in FIG. 2, firstly, the more light-emitting units is integrated, the more pins there is. As a result, the leading-wiring of the PCB becomes more complicated in the subsequent production process, and the design of a test socket is relatively more difficult when the test process is performed. Secondly, with the further reduction of the size of the LED module, the number of bonding-pads on the bottom of the substrate is too large, besides, some bonding-pads are even on the bottom edge of the substrate, which causes the problem of soldering tin leakage at the time of soldering, thereby affecting the visual effect of a finished product. The spilled tin in contact with the surrounding bonding-pads also easily leads to short-circuit devices.

Second, there are the problems of excessive plated-through holes and a complicated electrode connection line on the front surface of the substrate. In the production of packaging modules, the substrate is etched according to the designed line to facilitate subsequent electroless copper deposition and copper electroplating, die bonding and wire bonding, as shown in FIG. 4, but the above patents have complicated circuit design and excessive plated-through holes. Each connection region on the front surface of the substrate needs to be set plated-through holes. If it is necessary to reduce the number of bottom bonding-pads, the connection line is more complicated, and the number of via holes is even more, which makes it difficult to further reduce the size of the packaging module.

Third, there is a problem of short service life. In the production of RGB-LED packaging modules, an etching line is usually designed on the substrate, then electroless copper deposition and copper electroplating is performed, an RGB-LED chip is then arranged, die bonded and wire bonded, a layer of epoxy resin glue is molded on the chip, and finally, the substrate is cut to obtain a target module. However, the edge of the module obtained after cutting will have a cut metal line, as shown in FIG. 1, which is usually gold-plated copper. As time goes by, because a metal material and a resin material are different materials, the bonding performance is poor, and the joint of gold-plated copper and epoxy resin glue at the edge will be delaminated, which directly affects the air tightness of the packaging module, resulting in reduction of life of the packaging module. In actual production, some people solve the problem of delamination by using a manner of spraying a surface treating agent on the surface of the metal material, but the cost will be correspondingly improved.

Fourth, there is a problem of low soldering yield. The bonding-pads of the existing LED module are lower or uneven in height, and this is especially obvious in the case of a large number of pin bonding-pads. In the subsequent product process, the LED module is usually soldered to the PCB, but due to the fact that the bonding—are lower or uneven in height, it may lead to the problems that short circuit occurs or some bonding-pads are not successfully soldered during soldering Fifth, the produced LED display screen has low sharpness and is prone to the problem of light mixing. In the LED display screen, RGB LEDs are mixed in a same optical medium to form a mixed color light emission. In the single-package, after single LEDs are spliced and combined, light sources are independent, and there is a gap between one light source and another light source, which is not easy to cause a phenomenon of light mixing, and the sharpness thereof is relatively high. In the packaging module, there are a plurality of light-emitting units on the substrate, the plurality of light-emitting units are molded with the same glue layer. As shown in FIG. 3, different light-emitting units are in the same light guide medium. When light is reflected, diffused and scattered in the same optical medium, a plurality of light-emitting units may be prone to light mixing and color mixing, thus affecting the sharpness and definition of the LED display screen.

Sixth, there is a problem of power waste. Due to the characteristics of red chips, green chips and blue chips, the driving voltage of the red chips is about 2V, and the driving voltage of the blue chips and green chips is about 3V. For the small-pitch products on the market, an application terminal is generally driven by a voltage of 5V, and the red chips, green chips and blue chips are respectively connected in series with divider resistors having different resistances. Although this solution is simple and easy, it has two major drawbacks: first, the divider resistor generates a large amount of useless power, which greatly increases the overall power consumption of application terminal products; second, heat generated by the divider resistor increases the heat dissipation burden of the application terminal products, and affects the reliability and service life of the products.

Seventh, there is a problem of device heat dissipation. The problem of heat dissipation has always been a problem that restricts the development of the LED industry. If the temperature is too high, the LED will lose efficacy directly. In the LED display screen, there are millions of LEDs working at the same time, which will generate a lot of heat. The above patent fails to effectively solve this problem.

Therefore, the prior art has yet to be improved and developed.

SUMMARY OF THE INVENTION

The present invention is directed to a four-in-one mini-LED module, a display screen and a manufacturing method, intended to at least solve one of the problems in the prior art on the basis of the prior art, and provide a micro-pitch type LED packaging module which is adaptable to micro-size package, and has a simple line, a small number of bonding-pads, high production efficiency, high reliability, high weather resistance, long service life, high sharpness, high definition and good heat dissipation performance, and a display screen thereof.

In order to solve the above problems, the technical solution of the present invention is as follows:

A four-in-one mini-LED module comprises a substrate and four RGB-LED chip sets arranged in an array on the substrate; light-transmissive glue layers are sealed on the substrate and the RGB-LED chip sets; each RGB-LED chip set comprises an R chip, a G chip and a B chip; each chip has a first electrode and a second electrode, all the first electrodes have the same polarity, and the first electrode and the second electrode have opposite polarities; the first electrodes of all the chips of the same row in the module are electrically connected, the second electrodes of all the R chips of the same column are electrically connected, the second electrodes of all the G chips of the same column are electrically connected, and the second electrodes of all the B chips of the same column are electrically connected; and a patterned line layer is set on the front surface of the substrate and used for placement of chips and/or for electrical connection of the chips; the patterned line layer is provided with a plurality of conductive holes penetrating through the substrate; bonding-pads are disposed at the bottom of the substrate and electrically connected to the patterned line layer through the conductive holes; the bonding-pads used for achieving an electrical connection with an external circuit are arranged in an array and located on the inner side of the bottom surface of the substrate; the back surface of the substrate is coated with an insulating solder mask from which only the bonding-pads are exposed, and the bonding-pads comprises a plating layer or a mounted ball disposed on the bonding-pads.

According to the four-in-one mini-LED module, the height of the bonding-pads may be larger than the thickness of the solder mask by a range of −0.05 to 0.8 mm.

According to the four-in-one mini-LED module, the R chip may be a chip of vertical structure with the second electrode at the chip-substrate of the chip, the G chip and the B chip may be chips of horizontal structure; the R chip is fixed on the patterned line layer through a conductive glue to form an electrical connection, the G chip and the B chip are fixed on the patterned line layer through an insulating glue; the patterned line layer may comprise a plurality of electrical connection regions insulated from each other, and each electrical connection region may be provided with the conductive holes to achieve an electrical connection with the corresponding bonding-pads on the back surface of the substrate; the first electrode of the R chip and the first and second electrodes of the G chip and the B chip are electrically connected to the electrical connection region through bonding wires; and the R chips of the same column are fixed on the same electrical connection region and achieve an electrical connection through the electrical connection region.

According to the four-in-one mini-LED module, the number of the electrical connection regions may be 8, the number of the conductive holes is 8, and the number of the bonding-pads is 8.

According to the four-in-one mini-LED module, an optical virtual isolation region may be disposed between the RGB-LED chip sets; the optical virtual isolation region comprises a black light absorption layer disposed on the substrate, and the black light absorption layer comprises one or any combination of carbon black, graphite, carbon nano tube, industrial melanin, iron black, graphene, other black, dark brown or gray light absorption materials of the same kind.

According to the four-in-one mini-LED module, the light-transmissive glue layer may be a transparent/semitransparent epoxy resin layer or organic silica gel layer doped with industrial melanin and diffusion powder.

According to the four-in-one mini-LED module, the light-transmissive glue layer may be also doped with an infrared radiation heat dissipation material, and the infrared radiation heat dissipation material may comprise a mixture of a radiation material having an infrared emissivity larger than 0.8 and a high heat conductivity material.

According to the four-in-one mini-LED module, the substrate may be a multilayer board with at least one circuit layer set therebetween; the front surface, the back surface and the circuit layer of the substrate are electrically connected through the conductive holes, and the patterned line layers on the front surface of the substrate are located on the inner side of the substrate.

According to the four-in-one mini-LED module, the R chips, the G chips and the B chips may be flip chips.

According to the four-in-one mini-LED module, the first electrodes of all the R chips of the same row may be electrically connected, and led out separately.

A mini-LED display screen comprises the four-in-one mini-LED module as described above.

A manufacturing method of a four-in-one mini-LED module comprises the following steps:

substrate manufacturing process: conducting the processes of drilling, electroless copper deposition and copper electroplating, laminating, exposing, and etching in sequence, so as to obtain a substrate having a patterned line layer;

fixing RGB-LED chip sets to the substrate, and forming an electrical connection;

molding a light-transmissive glue layer on the front surface of the substrate, printing a solder mask on the back surface of the substrate, and reserving a bonding-pad region for arranging a plating layer or mounting a ball, so that the height of the bonding-pads is not lower than the thickness of the solder mask; and conducting the processes of cutting, optical and electrical tests, braiding, packaging and the like in sequence, so as to obtain the four-in-one mini-LED module.

Advantageous effects of the present invention comprises: the four-in-one mini-LED module, the display screen and the manufacturing method provided by the present invention, on the basis of a packaging module having a plurality of light emitting units originally applied by the applicant, the connection manner of a device is simplified by using the principles of row scanning and field scanning for the operation of the display screen, so that the number of pin bonding-pads is reduced by half; by using the principle of BGA packaging, the air tightness and weather resistance of the module are ensured, the service life of the device is prolonged, and the module can achieve packaging of a smaller size; an electrical connection is achieved by placing R chips of the same column on the same electrical connection region due to the fact that the chip-substrate of the R chip is an electric conductor, thus simplifying the connection line, reducing the number of conductive holes, and shortening the pitch accordingly; by providing an optical virtual isolation region, the problem of light mixing of the packaging module is solved, and the sharpness and definition of the display screen are improved; by separately leading out the first electrode of the R chip and separately supplying power, the problem of power waste is solved; and by providing the bonding-pads inside the bottom of the substrate and providing a multilayer substrate, the problem of air tightness of the packaging module is effectively solved, the weather resistance of the device is improved, and the service life of the device is prolonged.

Figure 1:
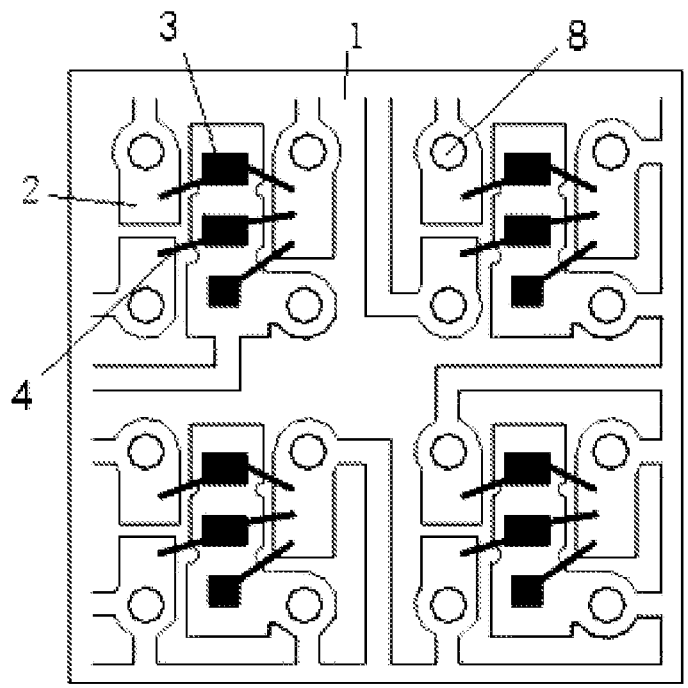
FIG. 1 is a front structure diagram of a four-in-one RGB-LED packaging module in the prior art.
Figure 2:
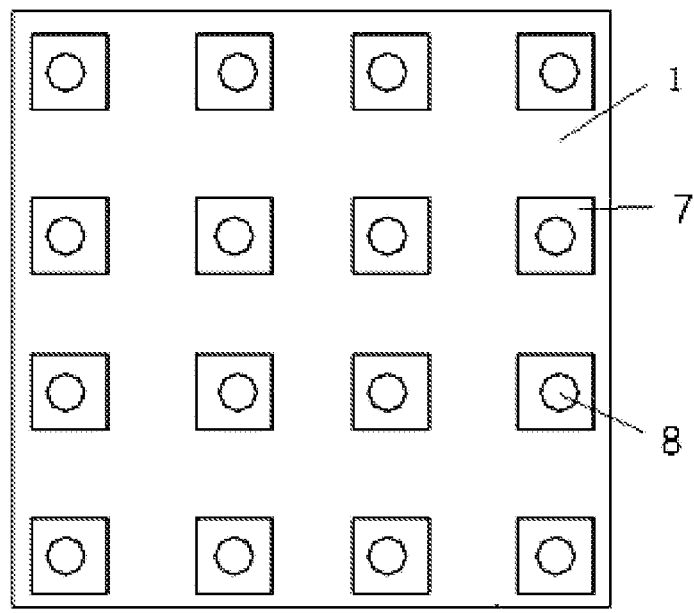
FIG. 2 is a back structure diagram of a four-in-one RGB-LED packaging module in the prior art.
Figure 3:
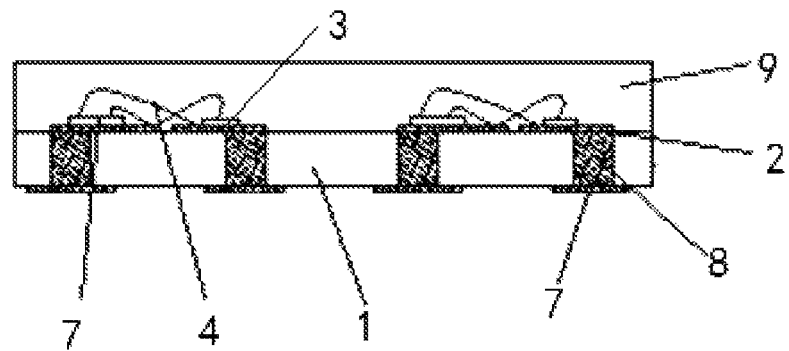
FIG. 3 is a section view of a four-in-one RGB-LED packaging module in the prior art.
Figure 4:
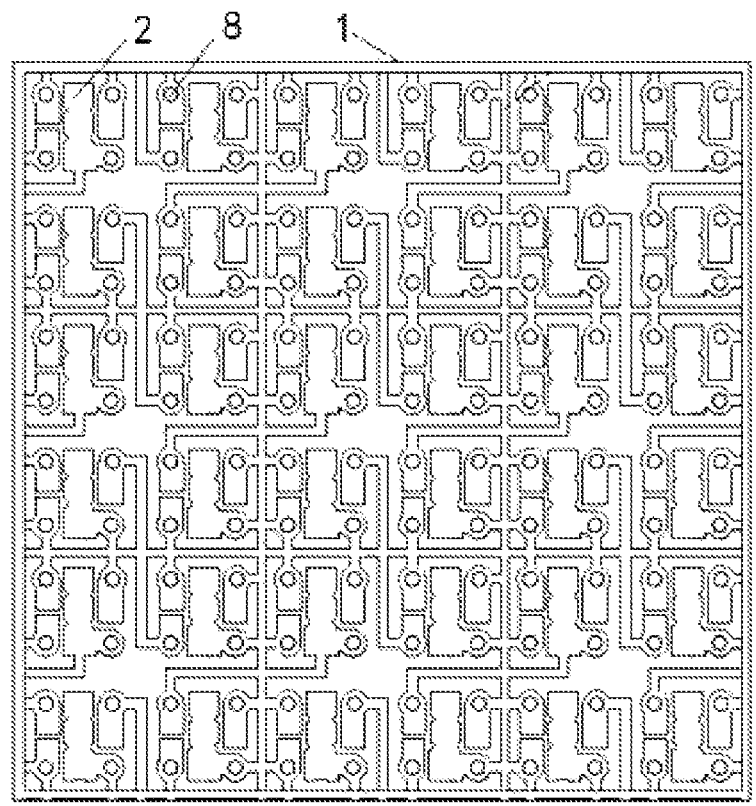
FIG. 4 is an uncut substrate diagram of a four-in-one RGB-LED packaging module in the prior art.

DESCRIPTION OF THE DRAWING REFERENCE SIGNS 1, substrate; 2, patterned line layer; 201, R chip electrical connection region; 202, G chip electrical connection region; 203, B chip electrical connection region; 204, common electrical connection region; 3, RGB-LED chip set; 301, R chip; 302, G chip; 303, B chip; 4, bonding wire; 5, first electrode; 6, second electrode; 7, bonding-pad; 701, plating layer or mounted ball; 8, conductive hole; 9, light-transmissive glue layer; 10, optical virtual isolation region; 11, circuit layer; 12, solder mask; 13, conductive glue; 14, insulating glue.

DETAILED DESCRIPTION OF THE INVENTION

Implementations of the present invention are described in detail below, and the examples of the implementations are illustrated in the drawings, where the same or similar reference numerals throughout indicate the same or similar elements or elements having the same or similar functions. The implementations described below with reference to the drawings are exemplary, only intended to be illustrative of the present invention and not to be construed as limiting to the present invention.

In the description of the present invention, it should be understood that orientation or position relationships indicated by the terms such as "center", "longitudinal", "transverse", "length", "width", "thickness", "up", "down", "front", "rear", "left", "right", "vertical", "horizontal", "top", "bottom", "inside", and "outside" are based on orientation or position relationships shown in the accompanying drawings, and are used only for ease and brevity of illustration and description of the present invention, rather than indicating or implying that the mentioned device or component must have a particular orientation or must be constructed and operated in a particular orientation. Therefore, such terms should not be construed as limiting to the present invention. In the description of the present invention, it should be noted that unless otherwise explicitly specified or defined, the terms such as "mount", "connect", and "connection" should be understood in a broad sense. For example, the connection may be a fixed connection, a detachable connection, or an integral connection; or the connection may be a mechanical connection or an electrical connection; or the connection may be a direct connection, an indirect connection through an intermediary, or internal communication between two components. A person of ordinary skill in the art may understand the specific meanings of the foregoing terms in the present invention according to specific situations.

In the present invention, unless otherwise explicitly specified or defined, the expression that a first feature is "on" or "beneath" a second feature may include that the first and second features are in direct contact, and may also include that the first and second features are not in direct contact but contact through additional features therebetween. Moreover, the expression that the first feature is "above" and "over" the second feature includes that the first feature is right above and diagonally above the second feature, or merely indicates that the first feature level is higher than the second feature. Moreover, the expression that the first feature is "below" and "under" the second feature includes that the first feature is right below and diagonally below the second feature, or merely indicates that the first feature level is lower than the second feature.

The following disclosure provides many different implementations or examples for implementing different structures of the present invention. In order to simplify the disclosure of the present invention, the components and arrangements of specific examples are described below. Of course, they are merely examples and are not intended to limit the present invention. In addition, the present invention may repeat reference numbers and/or reference letters in various examples, which are for the purpose of simplicity and clarity, and do not indicate a relationship between various implementations and/or arrangements discussed. In addition, the present invention provides examples of various specific processes and materials, but a person of ordinary skill in the art will recognize the application of other processes and/or the use of other materials.

Referring to FIG. 5 to FIG. 10, a four-in-one mini-LED module provided by the present invention comprises a substrate (1) and four RGB-LED chip sets (3) arranged in an array on the substrate (1). In the patent applied by the applicant previously, a plurality of RGB-LED chip sets (3) may be set on the substrate (1). In the present application, the applicant limits the number of RGB-LED chip sets (3) to 4, which not only meets the requirements for improving production efficiency, but also avoids the problem of influence on the entire screen consistency caused by chromatic aberrations in different batches due to too many integrated chip sets. Besides, the four RGB-LED chip sets (3) are arranged in an array, which meets the requirements of LED driving row and column scanning, thereby facilitating subsequent production and application.

In this embodiment, each RGB-LED chip set (3) comprises an R chip (301), a G chip (302), and a B chip (303). It should be noted that the number of the R chips (301), the number of the G chips (302) and the number of the B chips (303) may also be plural. For some special requirements or to enhance a certain color, for example, it may be set that there are two R chips (301), one G chip (302) and one B chip (303).

Each chip has a first electrode (5) and a second electrode (6), all the first electrodes (5) have the same polarity, and the first electrode (5) and the second electrode (6) have opposite polarities. In this embodiment, the first electrode (5) is an anode, and the second electrode (6) is a cathode. Of course, the first electrode (5) may also be a cathode, and in this case, the second electrode (6) is an anode.

Figure 12:
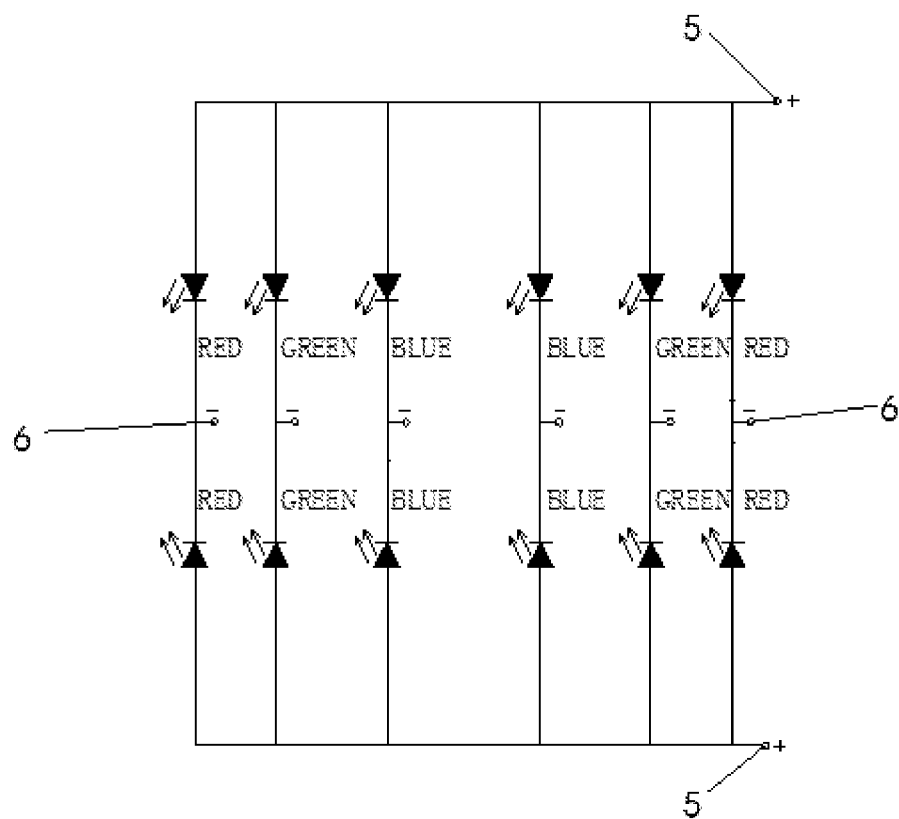
FIG. 12 is a circuit structure diagram of a four-in-one mini-LED module provided by the present invention.

Referring to FIG. 12, in order to solve the problem that the number of bonding-pads (7) on the back surface of the substrate (1) is excessive, by using the principles of row scanning and field scanning of an LED display screen, the first electrodes (5) of all the chips of the same row in the module are electrically connected, the second electrodes (6) of all the R chips (301) of the same column are electrically connected, the second electrodes (6) of all the G chips (302) of the same column are electrically connected, and the second electrodes (6) of all the B chips (303) of the same column are electrically connected. By using such a circuit connection manner, original 16 electrode pins are reduced to 8, and the number of corresponding bonding-pads (7) is reduced to 8, which solves the problem of excessive pin bonding-pads.

The substrate (1) is provided with a patterned line layer (2) for placement of chips and/or for electrical connection of the chips. The patterned line layer (2) is provided with at least one conductive hole (8) penetrating through the substrate (1). Bonding-pads (7) are disposed at the bottom of the substrate (1) and electrically connected to an electrical connection region (2) through the conductive hole (8), and all the bonding-pads (7) are located on the inner side of the bottom of the substrate (1). In this embodiment, all the bonding-pads (7) are located inside the bottom surface of the substrate (1), and are not exposed to the edge of the substrate (1). The non-exposed design of the bonding-pads (7) solves the visual effect problem caused by soldering tin exposure, further improves the weather resistance of a light source device, prolongs the service life, and achieves the packaging effect similar to the long life of an integrated circuit.

Figure 7:
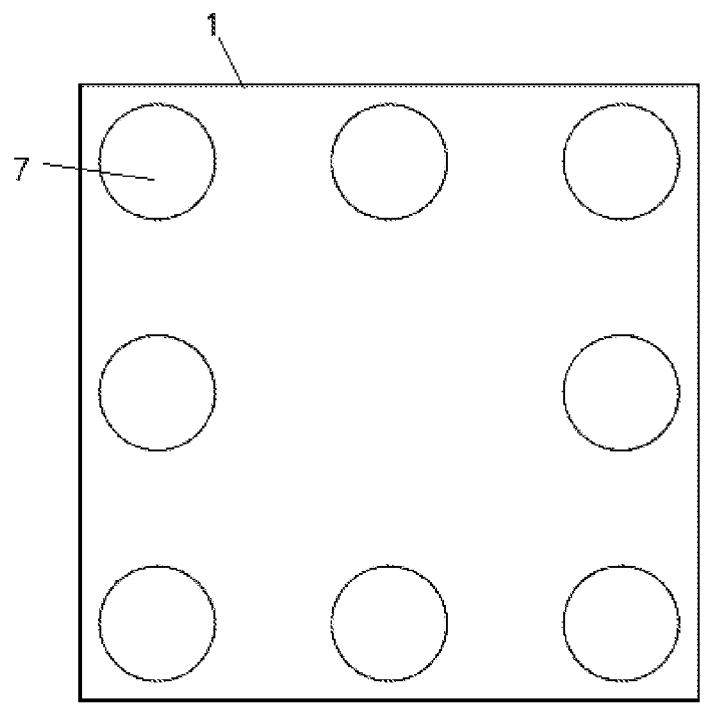
FIG. 7 is a back structure diagram of a four-in-one mini-LED module provided by the present invention.
Figure 8:
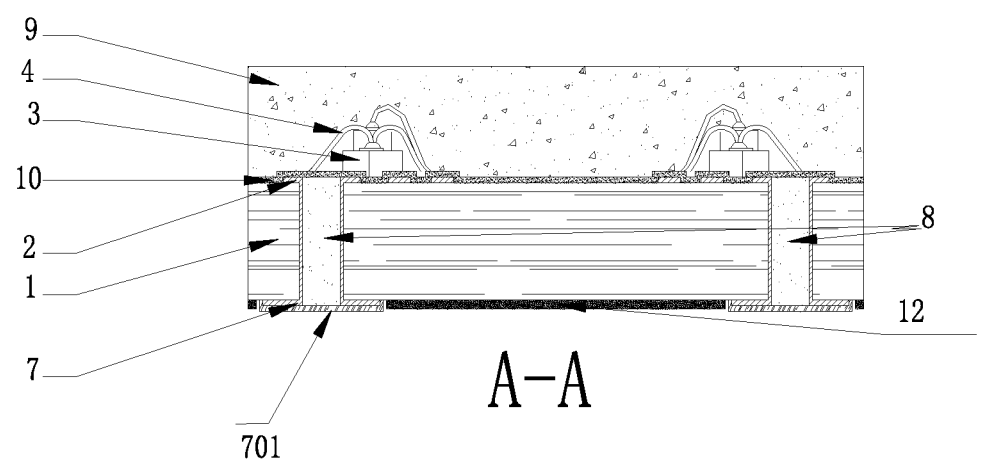
FIG. 8 is an A-A section view of a four-in-one mini-LED module provided by the present invention.
Figure 9:
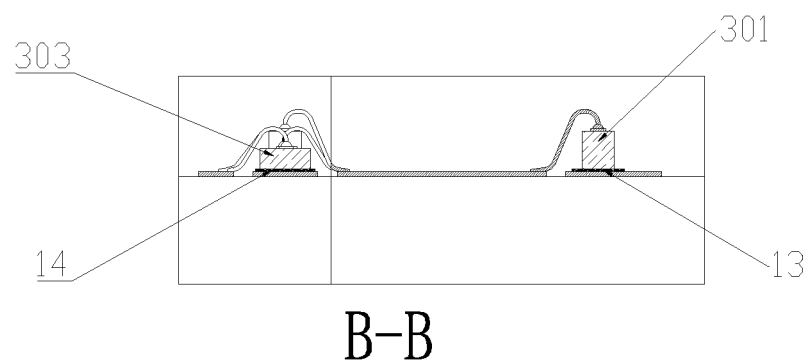
FIG. 9 is a B-B section view of a four-in-one mini-LED module provided by the present invention.
Figure 10:
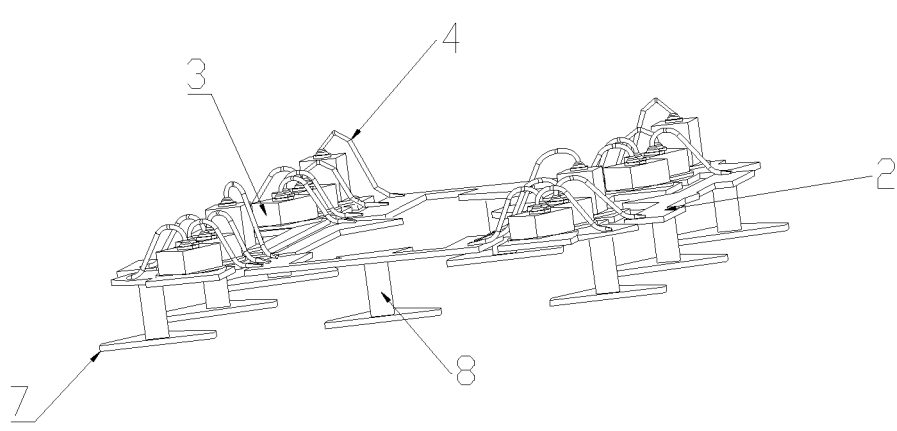
FIG. 10 is a circuit connection structure diagram of a four-in-one mini-LED module provided by the present invention.

Referring to FIG. 7 and FIG. 8, in this embodiment, the bonding-pads (7) are arranged in an array, and the bonding-pads (7) are all provided with a plating layer or a mounted ball (701). As the size of the packaging module becomes smaller and smaller, and the number of bonding-pads (7) on the back surface of the substrate (1) is increasing, the density thereof is also increasing. The present invention uses a manner of arranging the bonding-pads (7) in an array, greatly increases the number of bonding-pads of the device, reduces the size of the packaging module, and saves the occupation space. Furthermore, in a manner of providing plating layers or mounted balls (701), the conductive performance is increased, so that the packaging module is more suitable for high-density and micro-pitch packaging.

The above packaging manner is obtained by the present invention incorporating the characteristics of ball grid array (BGA) package. In today's information age, with the rapid development of the electronics industry, products such as computers and mobile phones are becoming more and more popular. People have increasing requirements on electronic products such as more functions, higher performance, smaller size and lighter weight. This has led to the development of electronic products in the direction of multi-function, high performance, miniaturization and light weight. In order to achieve this goal, the feature size of an IC chip is getting smaller and smaller, and the complexity is increasing. Therefore, the number of I/Os of the circuit is increasing, and the I/O density of package is increasing. In order to meet this development requirement, some advanced high-density packaging technologies have emerged, and a BGA package technology is one of them. BGA package emerged in the early 1990s and has evolved into a mature high-density package technology. However, BGA packages are currently used in the field of integrated circuits and have not applied in the field of LED packaging. This is because in the field of integrated circuits, it is only needed to consider the influence of electrical parameters for packaging, whereas in the field of LED packaging, in addition to considering the influence of electrical parameters, it is more important to consider the influence of optical parameters. The present invention uses the idea of Ball Grid Array (BGA) package. A light-transmissive glue layer (9) is disposed on the front surface of the substrate (1), and bonding-pads (7) are arranged in an array on the back surface of the substrate (1). A plating layer or mounted balls (701) are disposed on the bonding-pads (7), and all the bonding-pads (7) are located on the inner side of the bottom surface of the substrate (1), and are not disposed on the edge of the substrate (1). Compared with the conventional foot-mounted devices (such as QFP and PLCC), the bonding-pads of the present invention are arranged in an array on the back surface of the substrate (1), thereby greatly increasing the number of packageable bonding-pads of the device, reducing the package size, and saving the assembly occupation space. Generally, in the case where the number of leads is the same, the package size can be reduced by more than 30%.

Figure 5:
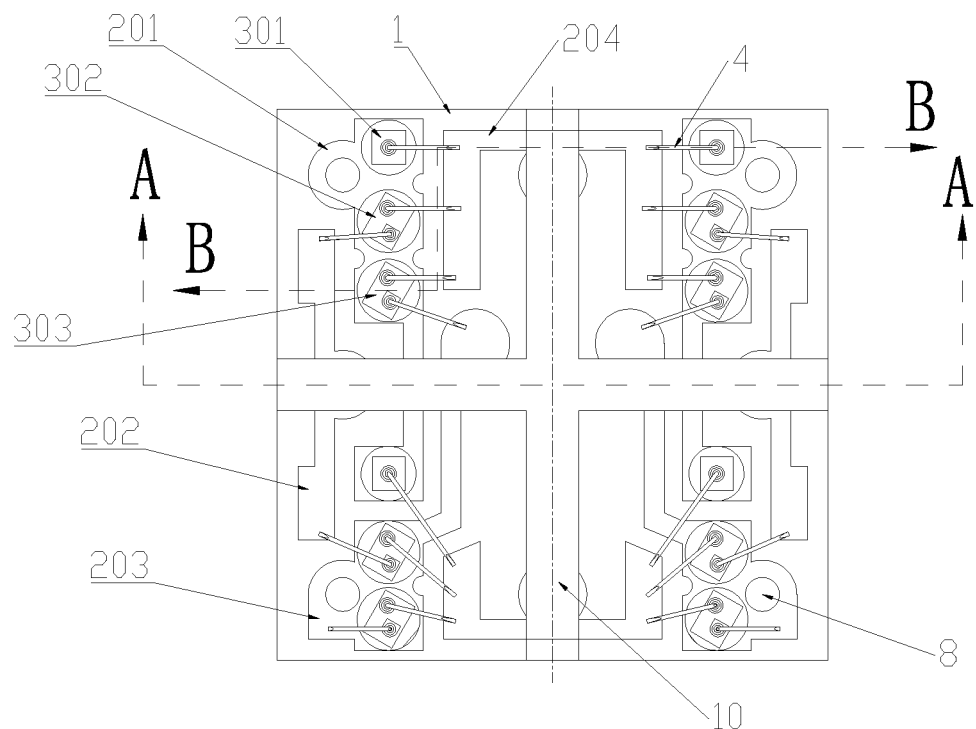
FIG. 5 is a front structure diagram of a four-in-one mini-LED module provided by the present invention.
Figure 6:
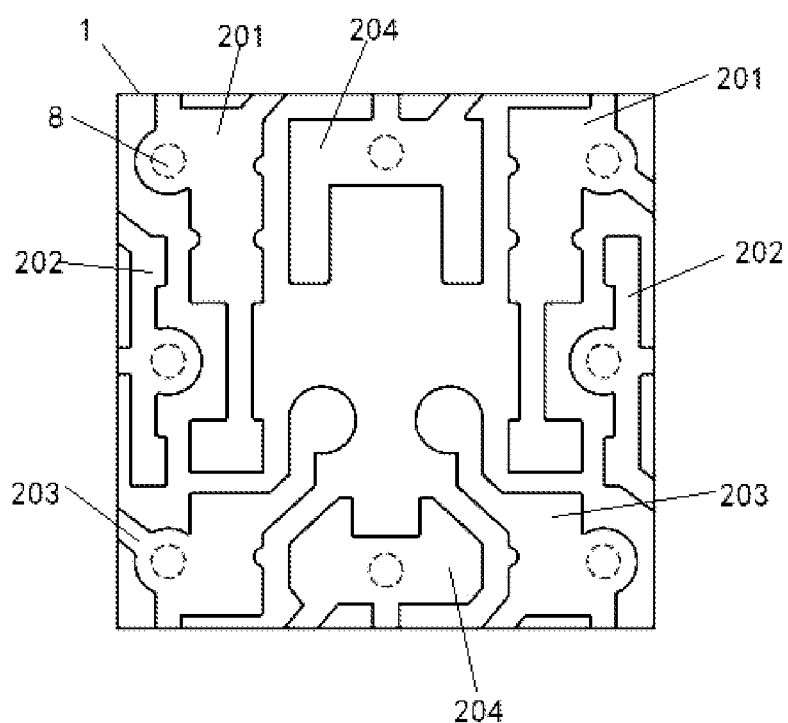
FIG. 6 is a front structure diagram of a substrate of a four-in-one mini-LED module provided by the present invention.

Referring to FIG. 5, the present invention achieves the above electrical connection by the patterned line layer (2). In this embodiment, referring to FIG. 5 and FIG. 9, the R chips (301) of the same column are die-bonded on the same R chip electrical connection region (201). The reason for this design is that the R chip is usually a chip of vertical structure made of a gallium arsenide material, the chip-substrate of the R chip is an electric conductor, which is also one of the electrodes of the LED chip; and the chip-substrates of the G chip and the B chip are insulated and are formed by performing metal-organic chemical vapor deposition (MOCVD) and epitaxial layer PN junction on sapphire. In the production process, the G chip and the B chip are fixed by an insulating glue (14), generally an insulating die bonding glue, so that the electrode on the chip has no electrode connection relationship with the substrate (1). And the chip-substrate of the R chip is connected to the substrate through a conductive die bonding glue by using a conductive glue (13), generally silver paste, so as to achieve the electrode connection, which is a common technical means for those skilled in the art. However, the present invention utilizes the characteristics that the chip-substrate of the R chip is an electric conductor, and combines the principles of row scanning and field scanning to place the R chips (301) of the same column on the same R chip electrical connection region (201), so as to achieve an electrical connection. Different from the conventional complicated line design, as shown in FIG. 5, according to the present invention, the R chips (301) of the same column are placed on the same R chip electrical connection region (201), and the G chips (302) of the same column and the B chips (303) of the same column can be electrically connected through the G chip electrical connection region (202) and the B chip electrical connection region (203) on both sides of the R chip electrical connection region (201), which greatly simplifies the line design, thereby reducing the size of the module and manufacturing the module in a smaller pitch.

As shown in FIG. 7, by the above design, the present invention successfully reduces the number of bonding-pads (7) on the back surface of the substrate (1) by half. In this embodiment, the number of RGB-LED chip sets (3) is 4, according to the prior art, the number of the bonding-pads (7) on the back surface of the substrate (1) is 16, and the number of the bonding-pads (7) on the back surface of the substrate (1) according to the present invention is only 8, which facilitates subsequent production processes such as testing and mounting.

Referring to FIG. 5 and FIG. 8, in this embodiment, an optical virtual isolation region (10) is set between the RGB-LED chips (3). The optical virtual isolation region (10) may comprise a black light absorption layer disposed on the substrate (1), and the black light absorption layer comprises one or a combination of carbon black, graphite, carbon nano tube, industrial melanin, iron black, graphene, other black, dark brown or gray light absorption materials of the same kind. An isolation groove provided on the light-transmissive glue layer (9) between the RGB-LED chip sets (3) may also be comprised. By providing the black light absorption layer, the black light absorption layer absorbs light which may cause mutual interference between the light-emitting units. Furthermore, providing the isolation groove, by utilizing the principle the refractive index of air is inconsistent with the refractive index of a packaging glue, making the light emitted by the RGB-LED chip set (3) reflected back to reduce the influence on the adjacent RGB-LED chip sets (3). Further, a black isolation frame is also filled in the isolation groove to minimize interference between the RGB-LED chip sets (3).

In actual production, the light-transmissive glue layer (9) is a transparent/semitransparent epoxy resin layer or organic silica gel layer doped with industrial melanin and diffusion powder. The addition of industrial melanin may be used to adjust the depth of the appearance color during the period, that is, to adjust the gray scale of the packaging module. The diffusion powder may achieve a function of light mixing in the packaging module.

Further, the glue layer is also doped with an infrared radiation heat dissipation material, and the infrared radiation heat dissipation material comprises a mixture of a radiation material having an infrared emissivity larger than 0.8 and a high heat conductivity material. The radiation material having an infrared emissivity larger than 0.8 comprises any one of mica powder, aluminium oxide, mullite, silicon oxide, and silicon carbide. The mica powder may be white mica powder or sericite or the like. In addition to the materials listed above, other radiation materials that can be foreseen by those skilled in the art having an infrared emissivity larger than 0.8 should also fall within the scope of protection of the present invention. The present invention preferably uses mica powder, and mixes the mica powder with the high heat conductivity material, so that heat can be more efficiently transmitted to the mica powder, thereby being converted into an infrared wave and radiated out. The mica powder body has many chemical functional bonds on the surface and is of a layered structure which can be well combined with the high heat conductivity material, so it is a very good dispersant and can also solve the huddling problem of the high heat conductivity material.

Figure 11:
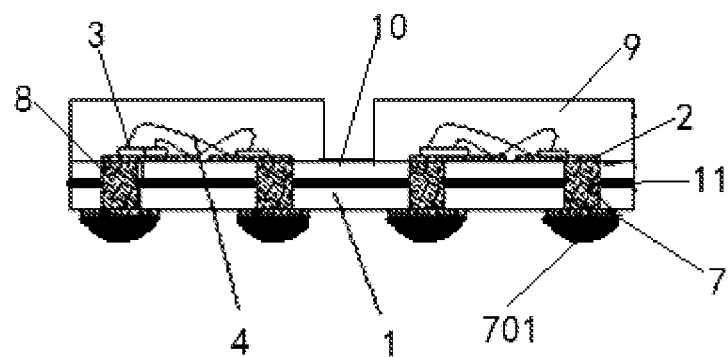
FIG. 11 is a structure diagram of another four-in-one mini-LED module provided by the present invention.

Referring to FIG. 11, the substrate (1) is a multilayer board, with at least one circuit layer (11) is set therebetween. And the front surface, the back surface and the circuit layer (11) of the substrate 1 are electrically connected through the conductive holes (8). In this embodiment, all the electrical connection regions (2) on the front surface of the substrate (1) are located inside the front surface of the substrate (1) without contacting the edges. Through the arrangement of the multilayer substrate, the connection circuit is set inside the substrate, and is not disposed on the front surface of the substrate, so as to avoid the delamination phenomenon with the front glue layer, thereby greatly improving the air tightness of the packaging module, and prolonging the service life thereof.

In an actual application, the R chips (301), the G chips (302) and the B chips (303) may also be flip-chips, and only the electrical connection region needs to be adaptively adjusted.

In an actual application, the first electrodes (5) of all the R chips (301) of the same row are electrically connected, and may be led out separately. By changing the conventional chip driving manner, the drive circuits of the R chips (301) is separated from that of the G chips (302) and the B chip (303), and provide separate power supply for the R chips (301), which lowers the driving voltage, thereby greatly reducing the power consumption.

The present invention also provides a mini-LED display screen, comprising the four-in-one mini-LED module as described above.

The present invention also provides a manufacturing method for a four-in-one mini-LED module, comprising the steps of:

substrate manufacturing process: conducting the processes of drilling, electroless copper deposition and copper electroplating, laminating, exposing, and etching in sequence, so as to obtain a substrate having a patterned line layer;

fixing RGB-LED chip sets to the substrate and forming an electrical connection;

molding a light-transmissive glue layer on the front surface of the substrate, printing a solder mask on the back surface of the substrate, and reserving a pad region for arranging a plating layer or mounting a ball, so that the height of the bonding-pads is not lower than the thickness of the solder mask;

conducting the processes of substrate cutting, optical and electrical testing, braiding, packaging and the like in sequence, so as to obtain the four-in-one mini-LED module.

In an actual application, the substrate may be an FR-4 board, a copper clad board, a PCB, a BT board, or the like. The substrate manufacturing process may specifically comprise the following steps of: drilling a through hole on the substrate; electroless copper deposition and copper electroplating on the substrate, and the electroplating may be conducted after a electroless copper deposition process to deposit a layer of copper in the through hole to make the through hole a conductive hole. In actual production, after forming the conductive hole, the conductive hole may be filled with a conductive material or a non-conductive material such as resin; after the electroless copper deposition and copper electroplating process is completed, the processes of laminating and exposing are performed, that is, a photosensitive dry film is laminated for exposure to form a pattern transfer; and the obtained substrate is etched to obtain a substrate with a patterned line layer.

In actual production, in step 2, the R chip may be fixed on the patterned line layer of the substrate by using a conductive glue, the G chip and the B chip are fixed on the patterned line layer of the substrate by using an insulating glue, and each chip is electrically connected to the patterned line layer by using a bonding wire.

Figure 13:
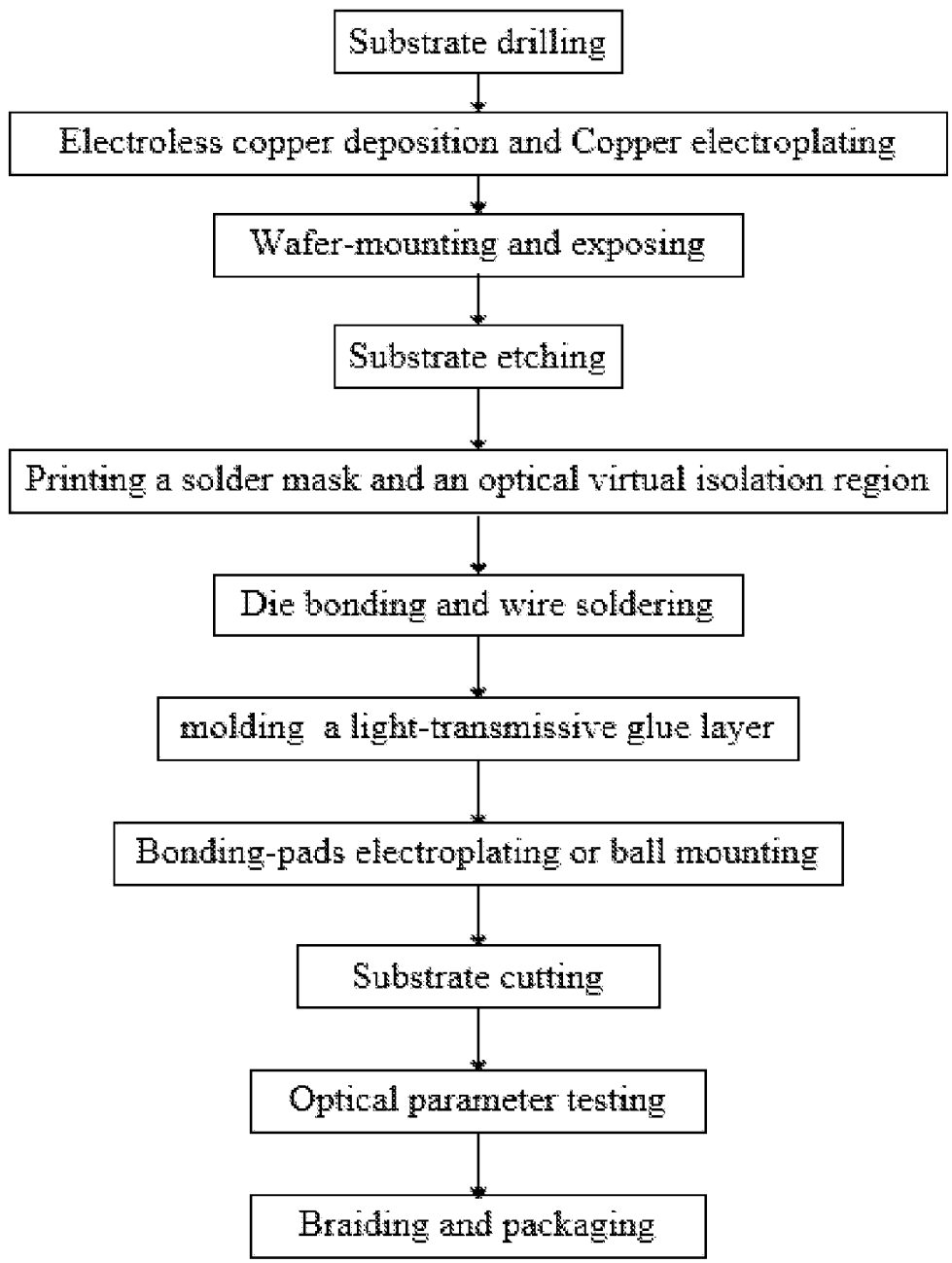
FIG. 13 is a manufacturing flowchart of a four-in-one mini-LED module provided by the present invention.

Referring to FIG. 13, it is an embodiment of a manufacturing method of a four-in-one mini-LED module provided by the present invention. The specific process may be: substrate drilling, electroless copper deposition and copper electroplating, laminating, exposing, etching, printing of a solder mask and an optical virtual isolation region, die bonding and wire soldering, molding of a light-transmissive glue layer, bonding-pad electroplating or ball mounting, cutting, optical parameter testing, braiding, and packaging.

It is to be understood that the application of the present invention is not limited to the above examples, and a person of ordinary skill in the art can make modifications or changes in accordance with the above description, all of which are within the scope of protection of the appended claims of the present invention.

What is claimed is:

1. A four-in-one mini-LED module, comprising:
a substrate and four RGB-LED chip sets arranged in an array on the substrate; wherein light-transmissive glue layers are sealed on the substrate and the RGB-LED chip sets;
each RGB-LED chip set comprises an R chip, a G chip and a B chip, each chip having a first electrode and a second electrode, all the first electrodes having the same polarity, and the first electrode and the second electrode having opposite polarities;
the first electrodes of all the chips of the same row in the module are electrically connected, the second electrodes of all the R chips of the same column being electrically connected, the second electrodes of all the G chips of the same column being electrically connected, and the second electrodes of all the B chips of the same column being electrically connected;
a patterned line layer is set on the front surface of the substrate and used for placement of chips and/or for electrical connection of the chips, the patterned line layer is provided with a plurality of conductive holes penetrating through the substrate;
bonding-pads are set at the bottom of the substrate, the bonding-pads being electrically connected to the patterned line layer through the conductive holes;
the bonding-pads are used for achieving an electrical connection with an external circuit.

2. The four-in-one mini-LED module according to claim 1, wherein the bonding-pads are arranged in an array and located on the inner side of the bottom surface of the substrate respectively; and
an insulating solder mask is coated on the back surface of the substrate with only the bonding-pads exposed, the pad comprising a plating layer or a mounted ball disposed on the bonding-pads.

3. The four-in-one mini-LED module according to claim 1, wherein the height of the bonding-pads is larger than the thickness of the solder mask by a range of −0.05 to 0.8 mm.

4. The four-in-one mini-LED module according to claim 1, wherein the R chip is a vertical structure chip with the second electrode at the chip-substrate of the chip, the G chip and the B chip being horizontal structure chips, the R chip being fixed on the patterned line layer through a conductive glue to form an electrical connection;
the G chip and the B chip are fixed on the patterned line layer through an insulating glue, the patterned line layer comprising a plurality of electrical connection regions insulated from each other, each electrical connection region being provided with the conductive holes to achieve an electrical connection with the corresponding bonding-pads on the back surface of the substrate;
the first electrode of the R chip and the first and second electrodes of the G chip and the B chip are electrically connected to the electrical connection region through bonding wires; and
the R chips of the same column are fixed on the same electrical connection region and achieve an electrical connection through the electrical connection region.

5. The four-in-one mini-LED module according to claim 4, wherein the number of the electrical connection regions is 8, the number of the conductive holes being 8, and the number of the bonding-pads being 8.

6. The four-in-one mini-LED module according to claim 1, wherein an optical virtual isolation region is set among the RGB-LED chip sets, the optical virtual isolation region comprising a black light absorption layer set on the substrate, the black light absorption layer comprising one or any combination of carbon black, graphite, carbon nano tube, industrial melanin, iron black, graphene, other black, dark brown or gray light absorption materials of the same kind.

7. The four-in-one mini-LED module according to claim 1, wherein the light-transmissive glue layer is a transparent/semitransparent epoxy resin layer or organic silica gel layer doped with industrial melanin and diffusion powder.

8. The four-in-one mini-LED module according to claim 7, wherein the light-transmissive glue layer is also doped with an infrared radiation heat dissipation material, the infrared radiation heat dissipation material being made from a mixture of a radiation material having an infrared emissivity larger than 0.8 and a high heat conductivity material.

9. The four-in-one mini-LED module according to claim 1, wherein the substrate is a multilayer board with at least one circuit layer is set therebetween; the front surface, the back surface and the circuit layer of the substrate are electrically connected through the conductive holes, and the patterned line layers on the front surface of the substrate are all located on the inner side of the substrate.

10. The four-in-one mini-LED module according to claim 1, wherein the R chips, the G chips and the B chips are flip chips.

11. The four-in-one mini-LED module according to claim 1, wherein the first electrodes of all the R chips of the same row are electrically connected, and led out separately.

12. A mini-LED display screen, comprising the four-in-one mini-LED module of claim 1.

* * * * *